United States Patent
Theofanopoulos et al.

(10) Patent No.: US 6,175,303 B1
(45) Date of Patent: Jan. 16, 2001

(54) ELECTRIC VEHICLE TORQUE-O-METER

(75) Inventors: John Theofanopoulos, Pontiac; Erik J. Hansen, Oxford, both of MI (US)

(73) Assignee: DaimlerChrysler Corporation, Auburn Hills, MI (US)

( * ) Notice: Under 35 U.S.C. 154(b), the term of this patent shall be extended for 0 days.

(21) Appl. No.: 09/298,238

(22) Filed: Apr. 22, 1999

(51) Int. Cl.$^7$ .................................................. B60Q 1/00
(52) U.S. Cl. ...................... 340/455; 340/438; 340/439; 340/441; 340/636; 324/435; 324/427; 320/48; 701/22
(58) Field of Search ..................... 340/455, 438, 340/439, 441, 459, 461, 462, 636; 324/435, 433, 429, 427, 428, 431; 320/48; 701/22

(56) References Cited

U.S. PATENT DOCUMENTS

| | | |
|---|---|---|
| 4,333,149 * | 6/1982 | Taylor et al. ................... 324/433 |
| 4,659,977 | 4/1987 | Kissel et al. . |
| 4,888,637 | 12/1989 | Sway-Tin et al. . |
| 4,899,256 | 2/1990 | Sway-Tin . |
| 5,371,412 * | 12/1994 | Iwashita et al. ................. 123/519 |
| 5,392,643 | 2/1995 | O'Kennedy et al. . |
| 5,561,380 | 10/1996 | Sway-Tin et al. . |
| 5,568,052 | 10/1996 | Sway-Tin et al. . |
| 5,612,608 * | 3/1997 | Ishiguro et al. ................. 324/435 |
| 5,619,417 | 4/1997 | Kendall . |
| 5,646,534 | 7/1997 | Kopera . |
| 5,698,983 * | 12/1997 | Arai et al. ....................... 324/427 |
| 5,808,469 | 9/1998 | Kopera . |
| 5,864,106 | 1/1999 | Hartwig et al. . |

* cited by examiner

Primary Examiner—Nina Tong
(74) Attorney, Agent, or Firm—Mark P. Calcaterra

(57) ABSTRACT

The present invention provides a system for monitoring usage of a electric vehicle's battery which offsets the display when the vehicle is in an on condition. A battery energy measuring device is provided which measures the conditions indicative of the maximum available current of the battery and generates a charge signal indicative of the conditions indicative of the maximum available current of the battery. A display is provided which is responsive to the charge signal for displaying the maximum available current of the battery. An offset device is provided which is responsive to the keyswitch to provide a keyswitch signal to the battery energy measuring device representative of the on and off condition of the keyswitch. The battery energy measuring device offsets the charge signal when the keyswitch is in an on condition such that the display displays the on and off condition of the keyswitch.

11 Claims, 1 Drawing Sheet

ELECTRIC VEHICLE TORQUE-O-METER

BACKGROUND OF THE INVENTION

I. Technical Field

The present invention relates to systems and methods for monitoring the transitory demands for electric current from the traction batteries of an electrically-powered vehicle, and more particularly, the present invention relates to systems and methods for monitoring the transitory demands for current from the vehicle's batteries and displaying the information in a format similar to that associated with a tachometer of an internal combustion engine.

II. Discussion

In an effort to improve air quality, battery-powered "electric" vehicles are becoming increasingly common in today's automotive marketplace. These electric vehicles typically include traction batteries for supplying electric current to one or more traction motors which, in turn, provide motive power to the vehicle. Accordingly, the vehicle's ability to perform a maneuver at any given time at the direction of the vehicle operator directly depends upon the condition of the traction batteries at that time. The condition of each battery, in turn, varies upon such transitory factors as its temperature and its state of charge, as well as other long-term factors such as battery aging, polarization effects, etc. Variation in these parameters will substantively affect the manner in which each battery can supply current to the vehicle's traction motors and, hence, the manner in which the vehicle will respond to commands from its operator. Stated another way, in certain situations or under certain load conditions, the vehicle's traction batteries may be unable to meet the transitory current demands of the vehicle which, in turn, will limit the vehicle's temporal capability to perform. As such, it is desirable to have a display or meter which provides information to the vehicle driver regarding the condition of the battery while power is being drawn therefrom.

One such device is generally disclosed in U.S. Pat. No. 5,568,052, entitled "Performance Monitor for Electric Vehicle," issued on Oct. 22, 1996 to Sway-Tin. This patent is owned by the Assignee of the present application and is herein incorporated by reference. This device generally discloses a system and method for displaying to the operator of an electric vehicle an indication of his present use of available battery current so that the operator may then form a reasonable expectation as to the vehicle's further capability to perform.

However, typical vehicle drivers associate the display in the '052 patent with a tachometer in an internal combustion engine driven automobile. The needle of typical tachometers usually jumps up and reads a predetermined RPM when the internal combustion engine is turned on. This is true even though the vehicle is at a standstill. As a result the vehicle driver can tell that the vehicle is on merely by observing the tachometer needle. However, the needle as disclosed in the '052 patent reads the same value when the vehicle is turned on and at a standstill and when the vehicle is turned off. Also, because electric vehicles are typically quiet, the vehicle driver cannot audibly determine whether the vehicle is on or off. As such it is desirable to provide a display which not only indicates the power consumption of a vehicle but also indicates when the vehicle is in an on condition.

Also, electric cars are fitted with a braking mechanism which charges the traction batteries. As such, it would be desirable to provide a display which indicates any recharging due to application of the brakes. The present invention was developed in light of these drawbacks.

SUMMARY OF THE INVENTION

The present invention overcomes the aforementioned drawbacks, among others, by providing a system for monitoring usage of a electric vehicle's battery which offsets the display when the vehicle is in an on condition. A battery energy measuring device is provided which measures the conditions indicative of the maximum available current of the battery and generates a charge signal indicative of the conditions indicative of the maximum available current of the battery. A display is provided which is responsive to the charge signal for displaying the maximum available current of the battery. An offset device is provided which is responsive to the keyswitch to provide a keyswitch signal to the battery energy measuring device representative of the on and off condition of the keyswitch. The battery energy measuring device offsets the charge signal when the keyswitch is in an on condition such that the display displays the on and off condition of the keyswitch.

In another aspect of the present invention, the battery energy measuring device offsets the charge condition in an opposite direction when the battery is being charged.

Additional advantages and features of the present invention will be apparent from the subsequent description and the appended claims taken in conjunction with the accompanying drawings.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
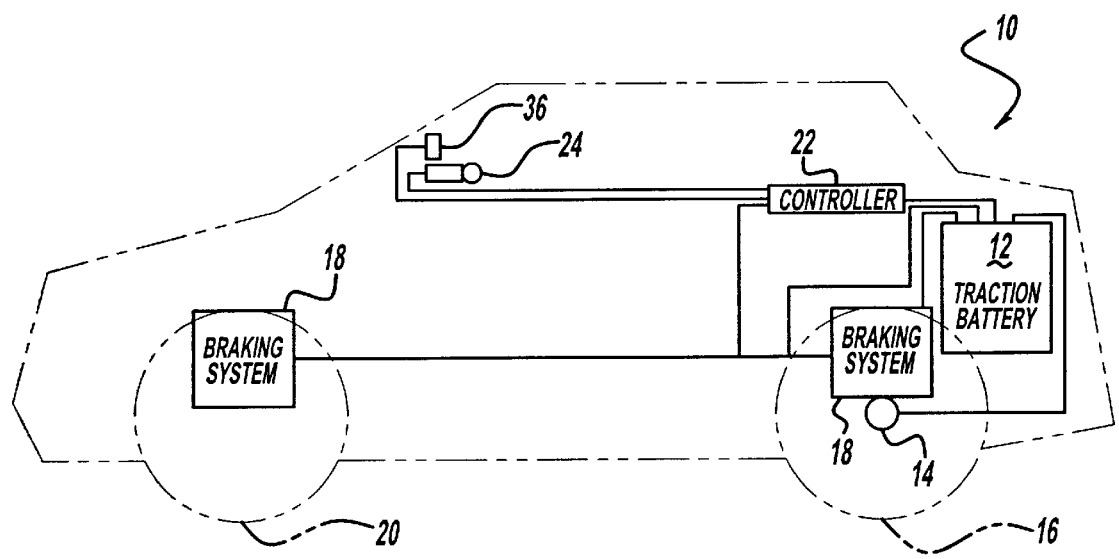
FIG. 1 is a cross-sectional view of a charging system being used in a vehicle according to the present invention.

Referring now to FIG. 1, an electric vehicle 10 is shown having a plurality of electrical elements distributed therein. A traction battery 12 is positioned in the rear portion of the electric vehicle 10, which electrically communicates with motor 14 to provide rotational energy to rear wheels 16. Braking systems 18 are rotationally engaged to rear wheels 16 and front wheels 20. As is known, braking systems 18 converts rotational energy from front wheels 20 and rear wheels 16 into electrical energy. This electrical energy is then transmitted to battery 12 for charging thereof.

Controller 22 is mounted to a fixed surface within electric vehicle 10 and contains various elements as will be discussed. Input to controller 22 keyswitch 24 provides an input to controller 22 representative of whether vehicle 10 is in an on condition. As such, keyswitch 24 provides an electrical signal required to allow controller 22 to provide electrical energy to motor 14 for rotational energy of rear wheels 16. Controller 22 provides an output to display 36 which indicates the operating conditions of vehicle 10 (as will be discussed). Display 36 provides these operating conditions to a vehicle driver seated within electric vehicle 10.

Figure 2:
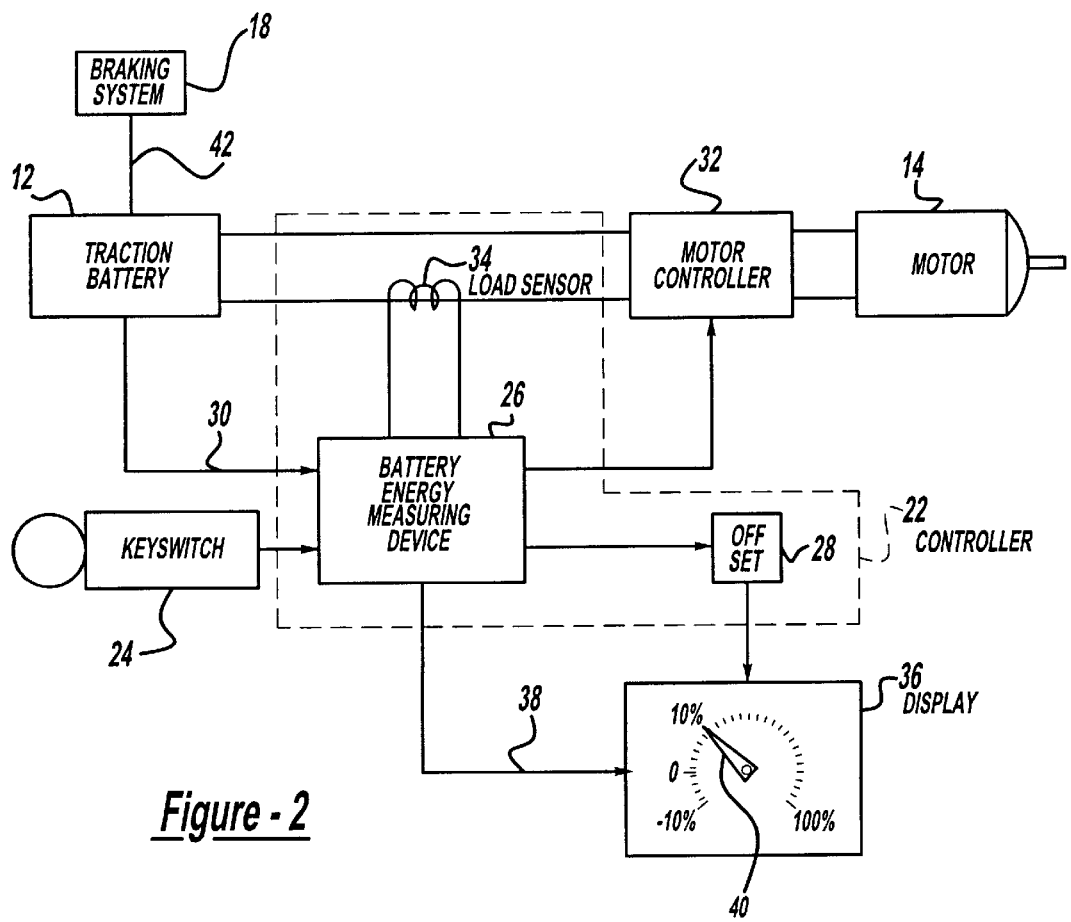
FIG. 2 is a schematic of a charging system according to the present invention.

Referring now to FIG. 2, a schematic of a current monitoring system according to the present invention is provided.

Here, controller 22 contains a battery energy measuring device 26 and an offset 28. However, it is noted that controller 22 could contain the system as disclosed in U.S. Pat. No. 5,568,052, issued on Oct. 22, 1996 and assigned to the assignee of the present application.

Traction battery 12 supplies a charging signal across bus 30 to battery energy measuring device 26 within controller 22. This signal is representative of the electrical charge state of traction battery 12. The specific battery parameters which result in the charge of traction battery 12 will be recognized by those of ordinary skill as including, without limitation, such parameters as temperature, state of charge, age, charging history, etc. The charging signal will also be indicative of other factors such as the variations between the parameters of individual cells in a multi-cell battery pack, including the presence of a bad cell in the battery pack. Motor controller 32 provides a conduit to supply electrical energy from traction battery 12 to motor 14. To vary the energy supply to motor 14, causing rotation of rear wheels 16, motor controller 32 adjusts the voltage and current provided therefrom in response to controller 22. Motor controller 22 provides this adjustment in response to the desires of the vehicle operator.

Battery energy measuring device 26 reads the current provided by traction battery 12 to motor controller 22. This information is provided by inductive load sensor 34, which thereby provides an input to battery energy measuring device 26 representative of the instantaneous current draw from traction battery 12. Battery energy measuring device 26 combines the signal received from inductive load sensor 34 and bus 30 and provides a charging signal to display 36 across bus 38 indicative of the available current of traction battery 12.

Display 36 is preferably an analogue display responsive to charging signal across bus 38. The display 36 is set up to have a sweeping needle 40 which is able to sweep across a path beginning at –10% and ending at a position of 100%. Between these two positions is located a plurality of segments dividing the display 36 into 10% increments.

Keyswitch 24 provides an aperture at a first end for receiving a vehicle driver's key and provides an output to battery energy measuring device 26 at a second end. The output to battery energy measuring device 26 provides a signal representing whether keyswitch 24 is in an on or an off condition. When keyswitch 24 is in an off condition, needle 40 is at rest at the –10% as shown on display 36. When keyswitch 24 is in an on condition, motor controller 22 enables the flow of electricity from traction battery 12 to motor 14. Also, when keyswitch 24 is an on condition, offset 28 is enabled by battery energy measuring device 26, thereby providing an offset signal to display 36. Display 36 receives this signal from offset 28 and repositions needle 40 a predetermined amount more toward the 100% mark than was provided by charging signal across bus 38. Preferably, this amount positions needle 40 at the 0% mark. It is noted, however, that needle 40 can move any predefined amount and is not limited to that disclosed in the application. As a result, when keyswitch 24 is an on condition and vehicle 10 is at a standstill, thus no draw from traction battery 12, needle 40 moves a predefined amount which notifies the vehicle operator that the vehicle is on. This movement is due to offset 28. A vehicle operator thus associates display 36 with a tachometer in typical internal combustion engine driven vehicle.

When vehicle 10 is braked, braking systems 18 transmits this braking force as electrical energy across wire 42. When this occurs, it is possible, and in fact likely, that the charge provided by braking system 18 exceeds the power drawn by motor 14. As a result, the available energy to motor 14 is greater than when the vehicle 10 is at a standstill. Because of this, battery energy measuring device 26 reads a voltage across bus 30 and a current from inductive load sensor 34 which corresponds to available energy from traction battery 12 exceeding normal. Battery energy measuring device 26 transmits a charging signal across bus 38 to display 36 which causes needle 40 to be pulled in a counterclockwise direction. Since offset 28 causes needle 40 to be positioned at 0% when keyswitch 24 is on and vehicle 10 is at a standstill, the charging signal provided across bus 38 causes needle 40 to be pulled towards –10%. This provides indication to the vehicle driver that traction battery 12 is being charged and more energy than normal is available to motor 14.

While the above detailed description describes the preferred embodiment of the invention, it should be understood that the present invention is susceptible to modification, variation, and alteration without deviating from the scope and fair meaning of following claims.

What is claimed is:

1. In an electric vehicle having a battery for supplying energy to a motor, a system for monitoring a usage of an available current of said battery, said system comprising:

a battery energy measuring device in electrical communication with said battery, said battery energy measuring device adapted to measure conditions indicative of said available current of said battery, said battery energy measuring device adapted to generate a charge signal indicative of said available current of said battery;

a display responsive to said charge signal for displaying said available current of said battery;

a keyswitch in electrical communication with said battery, said keyswitch having on and off conditions for respectively enabling and disabling a supply of energy from said battery to said motor; and an offset responsive to said keyswitch adapted to provide a keyswitch signal to said display representative of said on and said off conditions, said display responsive to said keyswitch signal by offsetting said charge signal when said keyswitch is in said on condition such that said display displays said on and said off conditions of said keyswitch.

2. A system as claimed in claim 1, wherein said battery energy measuring device is adapted to provide a negative charge signal responsive to charging of said battery.

3. A system as claimed in claim 2, wherein said electric vehicle has a braking system, said braking system adapted to charge said battery when said braking system is actuated, said battery energy measuring device adapted to provide said negative charge signal responsive to actuation of said braking system.

4. A system as claimed in claim 1, wherein said display has a sweeping needle responsive to said charging signal and said keyswitch signal, said display beginning with a –10% mark and ending with a 100% mark.

5. A system as claimed in claim 4, further comprising a 0% mark positioned between said –10% and said 100% mark, said needle positioned at said 0% mark when said keyswitch is in an on condition and said vehicle is in a non-moving condition.

6. An electric vehicle having a battery supplying energy to a motor, a system for monitoring a usage of an available current of said battery, said electric vehicle comprising:

a battery;

a motor in electrical communication with said battery;

a battery energy measuring device in electrical communication with said battery, said battery energy measuring device adapted to measure conditions indicative of said available current of said battery, said battery energy measuring device adapted to generate a charge signal indicative of said available current of said battery;

a display responsive to said charge signal for displaying said available current of said battery;

a keyswitch in electrical communication with said battery energy measuring device, said keyswitch having on and off conditions for respectively enabling and disabling a supply of energy from said battery to said motor; and an offset device in electrical communication with said battery energy measuring device, said battery energy measuring device responsive to said keyswitch to cause said offset device to emit a keyswitch signal to said display representative of said on and said off conditions, said keyswitch signal adapted to offset said charge signal when said keyswitch is in said on condition such that said display displays said on and said off conditions of said keyswitch.

7. An electric vehicle as claimed in claim 6, wherein said battery energy measuring device is adapted to measure a voltage of said battery.

8. An electric vehicle as claimed in claim 7, wherein said battery energy measuring device measures a current draw by said motor from said battery, said battery energy measuring device adapted to combine said voltage and said current draw to generate said charge signal.

9. An electric vehicle as claimed in claim 7, wherein said display has a sweeping needle responsive to said charging signal, said display beginning with a −10% mark and ending with a 100% mark and having increments of 10% therebetween.

10. In an electric vehicle having a battery for supplying energy to a motor, a method for monitoring a usage of an available current of said battery, said method comprising the steps of:

a. generating a charge signal representative of a maximum available current of said battery;

b. generating a keyswtich signal when said keyswitch is in an on condition;

c. offsetting said charge signal in a direction opposite to said offset signal when said battery is being charged;

d. displaying said charge signal combined with said keyswitch signal on a display for a vehicle operator.

11. A method as claimed in claim 10, wherein said charge is caused by a braking action on said vehicle.

* * * * *